United States Patent
Matsuda

(10) Patent No.: US 7,293,353 B2
(45) Date of Patent: Nov. 13, 2007

(54) METHOD OF FABRICATING RIGID FLEXIBLE PRINTED CIRCUIT BOARD

(75) Inventor: Norio Matsuda, Kyunggi-do (KR)

(73) Assignee: Samsung Electro Mechanics Co., Ltd., Kyunggi-Do (KR)

( * ) Notice: Subject to any disclaimer, the term of this patent is extended or adjusted under 35 U.S.C. 154(b) by 464 days.

(21) Appl. No.: 11/093,996

(22) Filed: Mar. 30, 2005

(65) Prior Publication Data

US 2006/0156542 A1    Jul. 20, 2006

(30) Foreign Application Priority Data

Jan. 20, 2005    (KR) ............ 10-2005-0005440

(51) Int. Cl.
 *H05K 3/36* (2006.01)
(52) U.S. Cl. .................. 29/830; 29/829; 29/846; 29/847; 29/852; 156/150; 156/292
(58) Field of Classification Search .......... 29/825, 29/829–835, 846–852; 174/255, 260–264; 156/150, 290, 292; 428/413–414; 361/679, 361/739, 752
See application file for complete search history.

(56) References Cited

U.S. PATENT DOCUMENTS

| | | | | |
|---|---|---|---|---|
| 4,915,983 | A | * | 4/1990 | Lake et al. .............. 430/314 |
| 5,262,594 | A | * | 11/1993 | Edwin et al. ............ 174/254 |
| 6,797,345 | B2 | * | 9/2004 | Okamoto et al. ......... 428/1.6 |
| 7,082,679 | B2 | * | 8/2006 | Myoung et al. ............ 29/830 |
| 7,180,315 | B2 | * | 2/2007 | Tunaboylu ............... 324/754 |

FOREIGN PATENT DOCUMENTS

| | | |
|---|---|---|
| JP | 5-243737 | 9/1993 |
| JP | 6-204663 | 7/1994 |
| JP | 2001-15917 | 1/2001 |
| JP | 2001-200234 | 7/2001 |

OTHER PUBLICATIONS

Patent Abstracts of Japan for JP2003231875 A published Aug. 19, 2003.
Patent Abstracts of Japan for JP2000332416 A published on Nov. 30, 2000.

* cited by examiner

*Primary Examiner*—Minh Trinh
(74) *Attorney, Agent, or Firm*—Darby & Darby

(57) ABSTRACT

Disclosed is a method of fabricating rigid flexible PCBs. In the method, a self-detachable adhesive tape is used to separate a wafer and a substrate from each other in the course of conventionally fabricating a semiconductor wafer, is employed to avoid inherent problems occurring in the conventional method of fabricating rigid flexible PCBs.

6 Claims, 7 Drawing Sheets

METHOD OF FABRICATING RIGID FLEXIBLE PRINTED CIRCUIT BOARD

INCORPORATION BY REFERENCE

The present application claims priority under 35 U.S.C. §119 to Korean Patent Application No. 2005-5440 filed on Jan. 20, 2005. The content of the application is incorporated herein by reference in its entirety.

BACKGROUND OF THE INVENTION

1. Field of the Invention

The present invention relates to a method of fabricating a rigid flexible printed circuit board (PCB). More particularly, the present invention pertains to a method of fabricating a rigid flexible PCB, wherein a self-detachable adhesive tape used to separate a wafer from a substrate in the course of conventionally fabricating a semiconductor wafer, is employed to avoid inherent problems occurring in a conventional method of fabricating the rigid flexible PCB.

2. Description of the Prior Art

In accordance with the recent trend toward miniaturized, light, and slim electronic devices, light, slim, and high density PCBs are in demand. Accordingly, the use of a multilayered flexible PCB capable of satisfying the above demand is rapidly growing. However, a process of fabricating the multilayered flexible PCB is complicated and has many stages compared to a process of fabricating a general rigid PCB, thus costs and defective fractions are high. Of multilayered rigid PCBs, recently, a rigid flexible PCB having a flexible portion has been employed to produce folding-type mobile phones, thus it is expected that demand for rigid flexible PCBs will rapidly grow.

The flexible portion of the rigid flexible PCB reduces workability in a process of producing goods and increases the defective fractions. The development of special material and a process employing same contribute to solving the above problems, thereby assuring superiority over rival companies.

In order to fabricate the flexible PCB, the formation of microcircuits using thin and strong material must be feasible. In other words, the selection of material and process is important. Polyimide resin has mainly been used as the material because there is no material usable as a substitute for polyimide resin with regard to heat resistance, mechanical strength, fire retardancy, and electrical properties. However, currently, material capable of being used as a substitute for polyimide resin has been developed with regard to high frequency response, moisture resistance, dimensional stability, and cost.

With respect to technology of processing microcircuits of the flexible PCB, a pitch of a connection part of a flat panel display, such as an LCD, becomes fine so as to be changed from 33 µm to 25 µm in accordance with an increase in resolution, thus slimness of copper foils and base films has been achieved so that they are both 5 µm in thickness. According to data from JEITA (Japan Electronic and Information Technology Industries Association), it is predicted that the flexible PCB must have a minimum conductor width/minimum gap (L/S) of 15 µm/12 µm in the year 2006 and L/S of 10 µm/10 µm in the year 2008, and that a tape substrate must have L/S of 7 µm/7 µm in the year 2006 and L/S of 5 µm/5 µm in the year 2010.

To satisfy the above conditions, there remains a need to develop technologies for forming microcircuits or to develop novel processes or novel materials.

FIGS. 1a to 1i are sectional views illustrating a procedure of fabricating a rigid flexible PCB, according to conventional technology.

FIG. 1a is a sectional view of a flexible base substrate 101 on which circuit patterns 102 are formed.

In FIG. 1b, a coverlay 103 is partially or totally applied on the substrate 101.

In FIG. 1c, prepregs 104 or bonding sheets are layered on both sides of the substrate 101. Since the prepregs 104 or the bonding sheets are physically rigid, prepreg portions 105a, 105b of the resulting structure become rigid portions, and the remaining portion 106 of the resulting structure, on which the prepregs 104 are not layered, becomes a flexible portion 106.

In FIG. 1d, thin copper foils 107 are layered on both sides of the substrate 101. At this stage, since a height difference exists between the rigid portions 105a, 105b in which the prepregs 104 are layered and the flexible portion 106 in which the prepregs 104 are not layered, a portion of the copper foil layered on the flexible portion 106 sinks, causing a gap 108a between the copper foil 107 and the coverlay 103 on the flexible portion 106. On a portion of the substrate on which the coverlay 103 is not applied, a larger gap 108b is formed between the flexible substrate 101 and the copper foil 107.

In the layering of the copper foils 107, heat and pressure are simultaneously applied to the prepregs 104 after the copper foils 107 are layered so that the copper foils 107 are stuck to prepregs 104. At this time, the prepregs 104 are melted and thus flow from the rigid portions 105a, 105b to the flexible portion 106.

If the prepregs flow downward as described above, the prepreg material is present on the flexible portion, thus the minimum curvature radius of the flexible portion is not the same as the set design value.

In FIG. 1e, a via hole 109 is formed through a portion of the rigid portions 105a, 105b, and copper plating layers 112 are formed on a wall of the via hole 109 and on external layers of the substrate through a plating process. The formation of the via hole 109 is mostly conducted using laser drilling or mechanical drilling. Typically, after the via hole 109 is formed, a desmear process is implemented to remove impurities from around the via hole.

In FIG. 1f, a copper plating process is conducted on both sides of the substrate to form the copper plating layers 112 on surfaces of the substrate and on the wall of the via hole 109.

In FIG. 1g, dry films 111 are applied on both sides of the substrate. A portion of the copper foil 107 on the flexible portion 106 has already sunk, and portions of the dry films 111 on the sunk portions of the copper foils 107 sink, forming additional gaps 110a, 110b between the copper foils 107 and the dry films 111.

In FIG. 1h, the dry films 111 are exposed and developed to form etching resist patterns. At this stage, since the dry films 111 are not flat but have recesses, the dry films are nonuniformly exposed during an exposure process, resulting in the formation of undesirable etching resist patterns.

In FIG. 1i, etching is conducted to form circuit patterns on the copper foils 107, and etching resists are stripped, thereby creating the rigid flexible PCB.

In the fabrication of the rigid flexible PCB according to conventional technology, as shown in FIG. 1i, a height difference exists between the rigid portions 105a, 105b and the flexible portion 106, thus the prepregs flow down on the flexible portion 106 during the heating and pressurizing processes of FIG. 1d, causing gaps 108a, 108b, 110a, 110b between the copper foils 107 and the coverlay 103 and between the copper foils 107 and the dry films 111, resulting in defective products.

In order to avoid the problems of nonuniform exposure of the dry films 111 as shown in FIG. 1h, a laser direct imaging (LDI) process, in which exposure is conducted with a laser device used in conventional laser drilling, may be employed so as to expose recesses or corners, onto which light is not easily radiated, during the exposure. However, this process is problematic in that productivity is very poor.

With respect to this, Japanese Patent Laid-Open Publication No. 2000-332416 discloses a method of fabricating a PCB, in which an external base film is layered on a cable portion as well as on a rigid portion so as to protect the cable portion corresponding to a flexible portion in a rigid flexible multilayered PCB. The external base film is removed from the cable portion after various chemical treatments, making the requirement for a cover film, which protects the cable portion corresponding to the flexible portion from the chemical treatments conducted during the fabrication of the PCB, unnecessary.

Having been layered on only the rigid portion, the external base film is layered on the flexible portion as well as on the rigid portion in the above method, thereby avoiding problems caused by a height difference between the rigid portion and the flexible portion. In this regard, the external base film layered on the flexible portion must be removed afterwards, but the above patent does not suggest a method of removing the external base film. The external base film has adhesive strength due to heat and pressure in the course of fabricating the PCB, thus it is very difficult to remove the external base film from the cable portion corresponding to the flexible portion. Additionally, when it is removed, a product may be damaged, or residues may remain on the product. With respect to this, the patent describes that it is preferable to attach the external base film to the flexible portion so that the attachment is not very strong. However, this is not a fundamental solution.

An adhesive material disclosed in Japanese Patent Laid-Open Publication No. 2003-231875 may be employed to produce an adhesive tape used in the present invention.

SUMMARY OF THE INVENTION

Therefore, an object of the present invention is to avoid problems of defective products resulting from a gap, which is caused by a height difference between rigid and flexible portions, in a conventional method of fabricating a rigid flexible PCB.

Another object of the present invention is to avoid problems of undesirable exposure due to the height difference between the rigid and flexible portions in the conventional method of fabricating the rigid flexible PCB.

Still another object of the present invention is to avoid problems of flow of an insulating base film onto the flexible portion, which is caused by the height difference between the rigid and flexible portions, in the conventional method of fabricating the rigid flexible PCB.

Yet another object of the present invention is to provide a method of completely removing the insulating base film layered on the flexible portion, so as to avoid the problem with respect to the height difference between the rigid and flexible portions.

A further object of the present invention is to provide a method of fabricating the rigid flexible PCB, in which reliability and defective fractions of products are significantly improved.

The above objects can be accomplished by providing a method of fabricating a rigid flexible PCB. The method includes the steps of forming first circuit patterns on both sides of a flexible base substrate; applying a coverlay on a portion of the circuit patterns or on whole circuit patterns; attaching self-detachable adhesive tapes to flexible portions of both sides of the flexible base substrate; layering rigid insulating layers on rigid portions of both sides of the flexible base substrate; forming via holes and second circuit patterns on the rigid portions of the flexible base substrate; conducting a predetermined treatment process for the self-detachable adhesive tapes to separate the self-detachable adhesive tapes from the flexible base substrate; and removing the self-detachable adhesive tapes.

In the method of fabricating the rigid flexible PCB according to the present invention, the self-detachable adhesive tapes are layered on the flexible portions so that the tapes have the same thickness as the rigid portions, and external layer circuits are formed on the rigid portions through a conventional process. Subsequently, ultraviolet rays are radiated onto the adhesive tapes layered on the flexible portions, or the tapes are subjected to a predetermined treatment process so that the tapes are easily removed.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

Hereinafter, a detailed description will be given of the present invention, with reference to the drawings.

FIGS. 2a to 2d are sectional views illustrating the attachment of an adhesive tape in the course of fabricating a rigid flexible PCB according to the present invention.

Figure 1A:
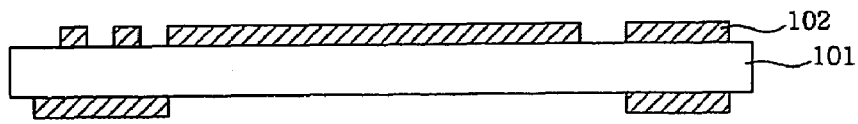
FIGS. 1a to 1i are sectional views illustrating a procedure of fabricating a rigid flexible PCB, according to conventional technology.
Figure 1B:
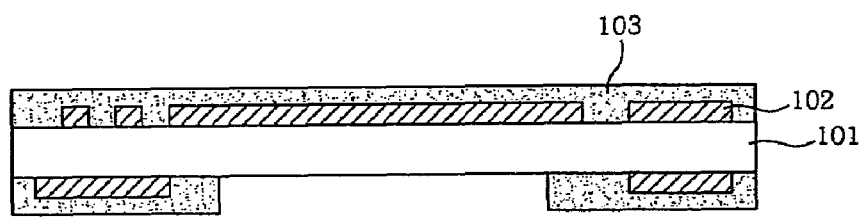
Figure 1C:
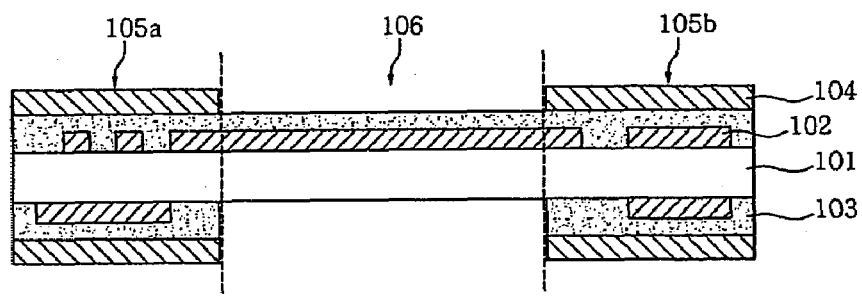
Figure 1D:
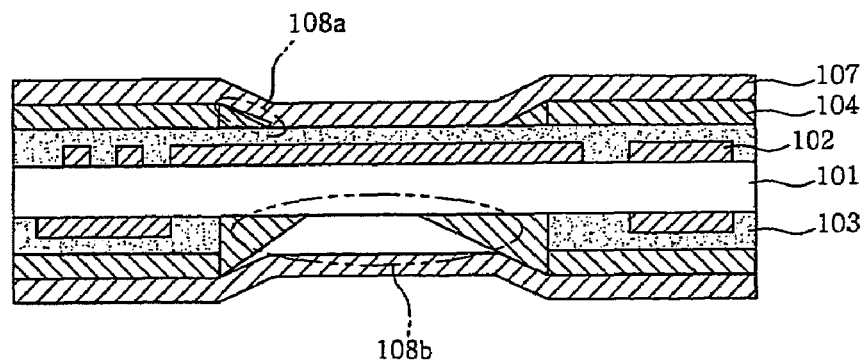
Figure 1E:
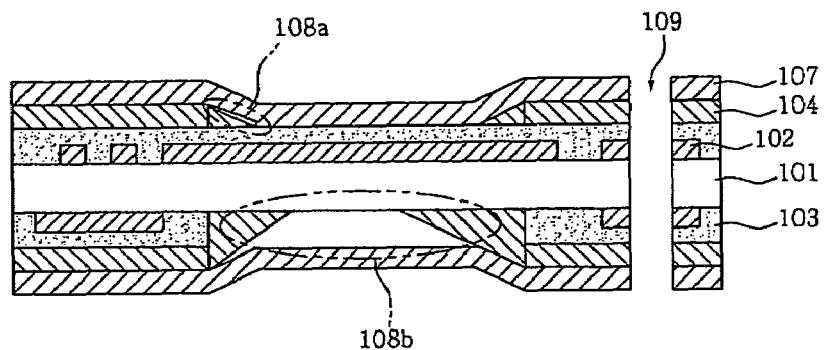
Figure 1F:
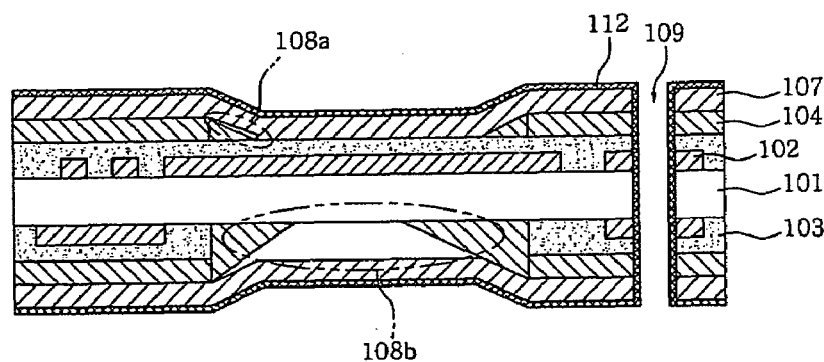
Figure 1G:
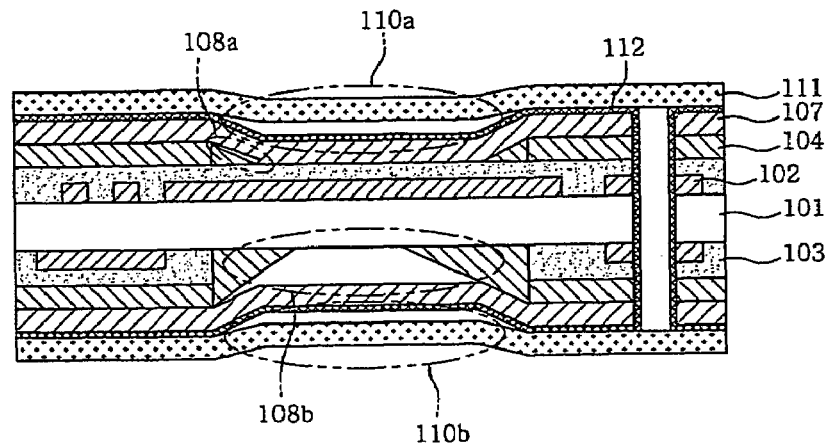
Figure 1H:
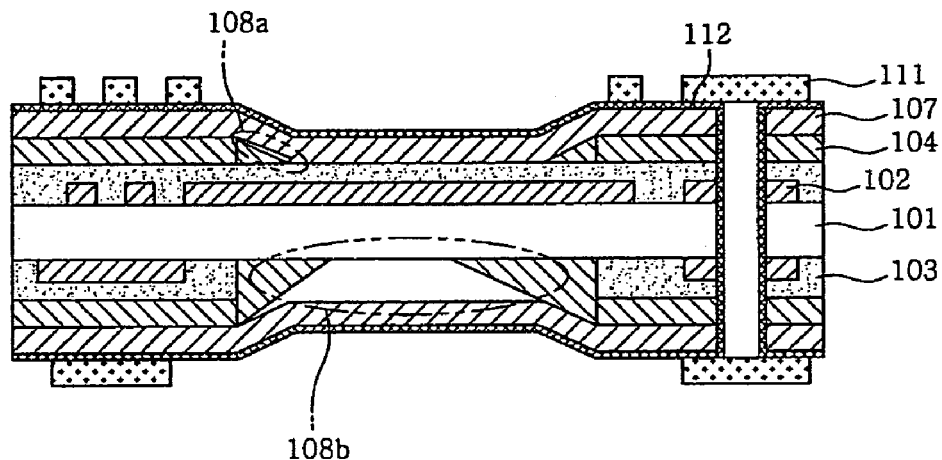
Figure 1I:
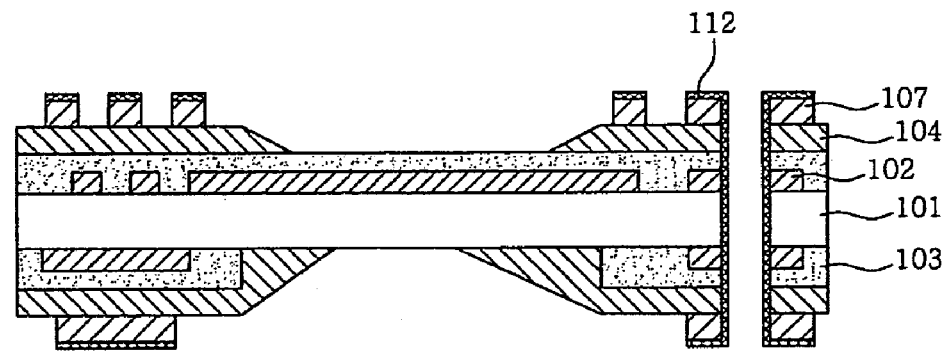
Figure 2A:
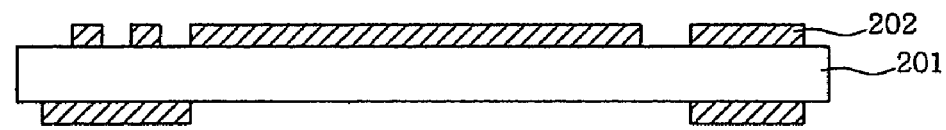
FIGS. 2a to 2d are sectional views illustrating attachment of an adhesive tape in the course of fabricating a rigid flexible PCB according to the present invention.

FIG. 2a is a sectional view of a flexible base substrate 201 on which circuit patterns 202 are formed. It is preferable that the flexible base substrate 201 be made of polyimide resin having excellent heat resistance, mechanical strength, fire retardancy, and electric properties.

To fabricate the substrate shown in FIG. 2a, copper foils are layered on the flexible substrate made of the polyimide resin, proper etching resist patterns are formed on the copper foils, and etching is conducted to form circuit patterns 202.

Figure 2B:
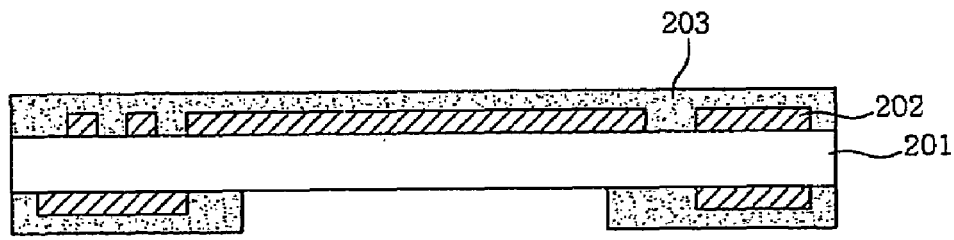

In FIG. 2b, a coverlay 203 is partially or totally applied on the substrate 201. The coverlay 203 serves to protect the circuit patterns 202, and is flexible. Additionally, the coverlay must have insulation properties. The coverlay 203 may be applied on the entire surface of, or a portion of, the substrate 201.

Figure 2C:
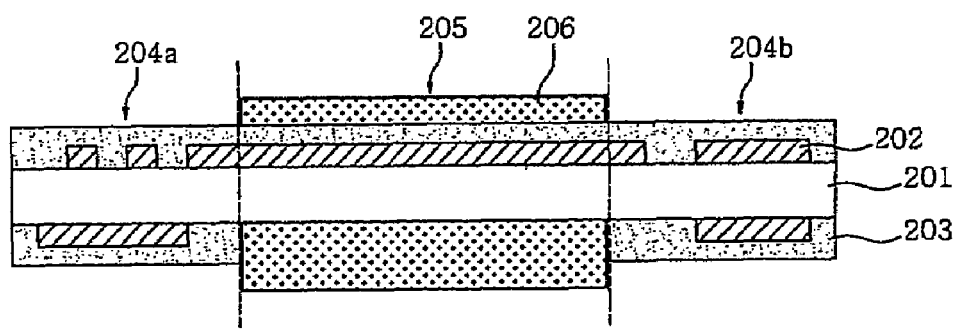

In FIG. 2c, self-detachable adhesive tapes 206 are layered on flexible portions 205 of the substrate 201. The self-detachable adhesive tapes 206 must easily be separated from the coverlay 203 or from the base substrate 201 when ultraviolet rays are radiated thereonto or the resulting structure is subjected to predetermined treatments. Furthermore, each adhesive tape 206 must have desirable resistance to subsequent chemical and heat treatments. The adhesive tape 206 must have a thickness that is the same as that of an insulating base film, such as a prepreg, to be layered on rigid portions 204a, 204b.

It is preferable to use an adhesive tape 206 disclosed in Japanese Patent Laid-Open Publication No. 2003-231875, and "Selfa" (commercial name), manufactured by Sekisui Chemical Co., Ltd. in Japan, may be employed.

Selfa is an adhesive tape which is easily separated from an adhesion surface due to the generation of nitrogen gas at the adhesion surface when ultraviolet rays are radiated thereonto.

There are many types of Selfas, but it is preferable to use Selfa, which is capable of withstanding heat at 170-180° C. for 1-2 hours, so as to endure pressure and heat used during the fabrication of the PCB as will be described later. Additionally, it is preferable to use tape- or film-type Selfa because solution-type Selfa has a problem related to washing of dissolved components.

Instead of Selfa, any material may be used to produce the adhesive tape 206 if the material is separated from the adhesion surface of the tape by ultraviolet rays or other treatments, is flexible, and has sufficient heat resistance.

The adhesive tape 206 may be attached through a printing process, a photography process, or a lamination process, and must be attached so as to have a thickness that is the same as that of the insulating base film to be layered on the rigid portions 204a, 204b.

Figure 2D:
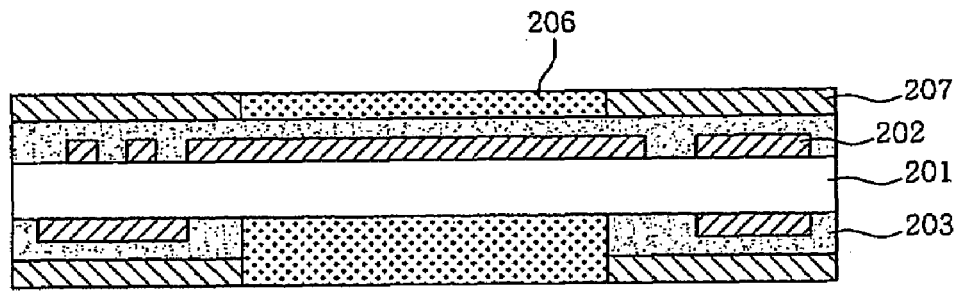

In FIG. 2d, the insulating base films 207 are layered on the rigid portions 204a, 204b. The insulating base films 207 must be hard so as to support the rigid portions, and be properly melted by heat so as to act as an interlayer adhesive. It is preferable to use a prepreg, which is most frequently used as an insulating layer in the course of fabricating a multilayered PCB, as the insulating base film 207 satisfying the above requirements. Subsequently, a circuit layer is layered on the insulating base film 207, and a circuit pattern and a via hole are formed.

FIGS. 3a to 3e are sectional views illustrating the formation of the circuit pattern and the via hole on the rigid portions 204a, 204b in the course of fabricating the rigid flexible PCB according to the present invention.

Figure 3A:
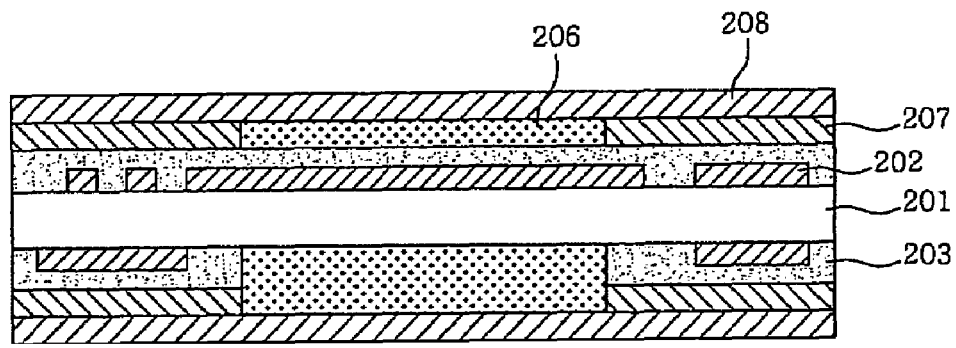
FIGS. 3a to 3e are sectional views illustrating formation of a circuit pattern and a via hole on a rigid portion in the course of fabricating the rigid flexible PCB according to the present invention.

In FIG. 3a, copper foils 208 are layered on both sides of the substrate using a press. When the insulating base film 207 is heated and pressed by the press, the insulating base film has fluidity due to heat, but the insulating base film 207 does not flow down onto the flexible portion 205 because of the adhesive tape 206.

Figure 3B:
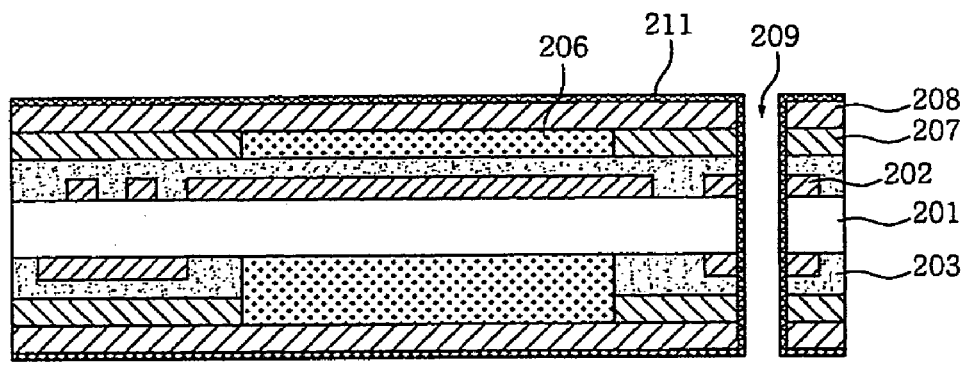

In FIG. 3b, a via hole 209 is formed using a laser drilling process or a mechanical drilling process, and copper plating layers 211 are formed on a wall of the via hole 209 and on external layers by plating. After the via hole is formed using the laser drilling process or mechanical drilling process, it is preferable to conduct a desmear process so as to remove impurities or residues from around the via hole 209.

Figure 3C:
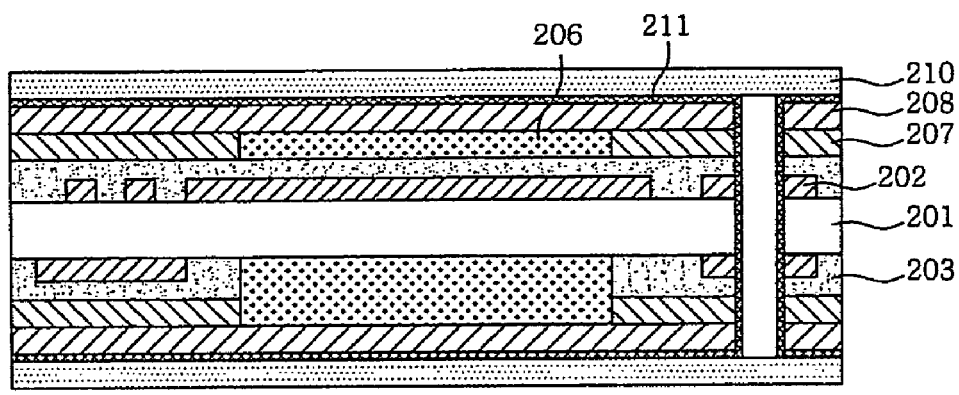

In FIG. 3c, photosensitive etching resists 210 are applied or laminated, and etching resist patterns are formed during exposure and development processes. It is preferable to use a dry film as the etching resist 210.

Figure 3D:
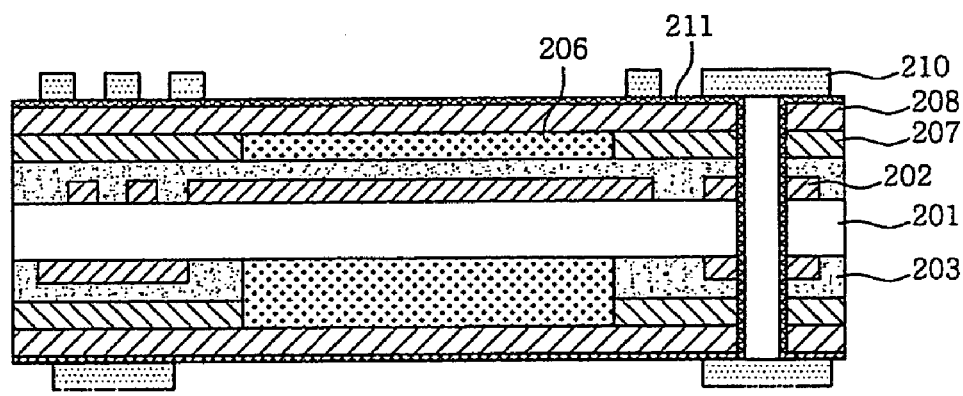

In FIG. 3d, the substrate is etched to form circuit patterns on the copper foils 208.

Figure 3E:
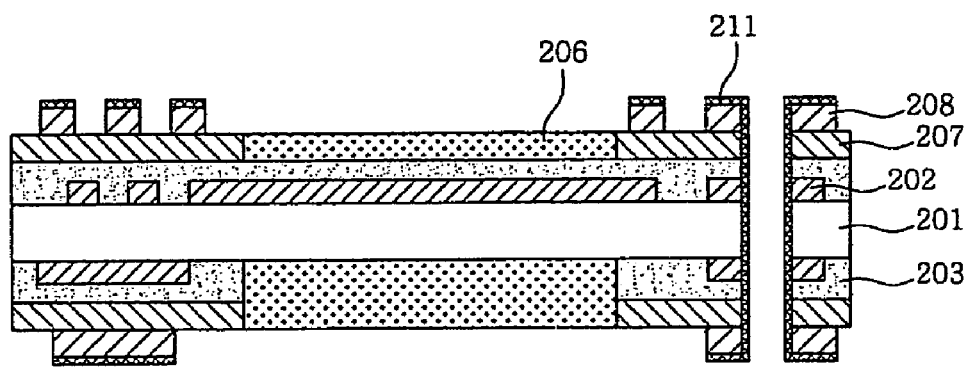

In FIG. 3e, the etching resists 210 are removed. The substrate is immersed in a stripping solution to strip the etching resists 210.

Figure 4A:
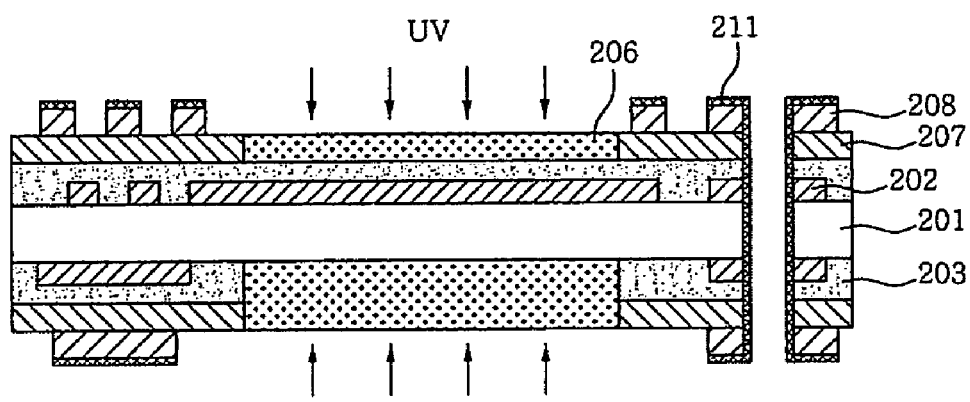
FIGS. 4a to 4c are sectional views illustrating removal of the adhesive tape in the course of fabricating the rigid flexible PCB according to the present invention.
Figure 4B:
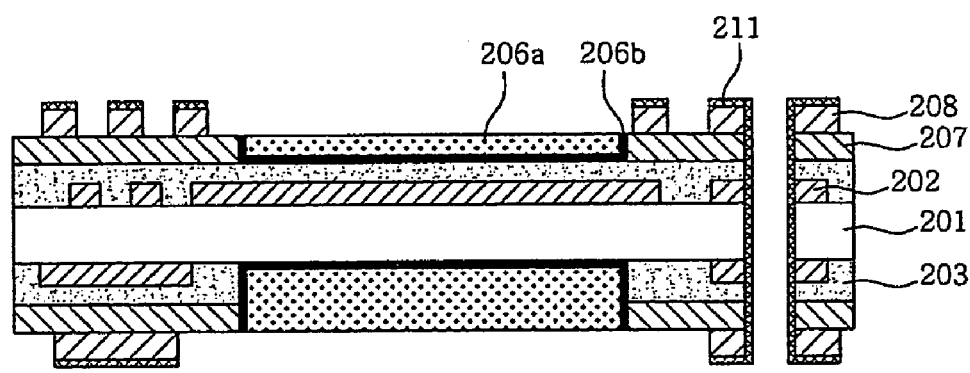
Figure 4C:
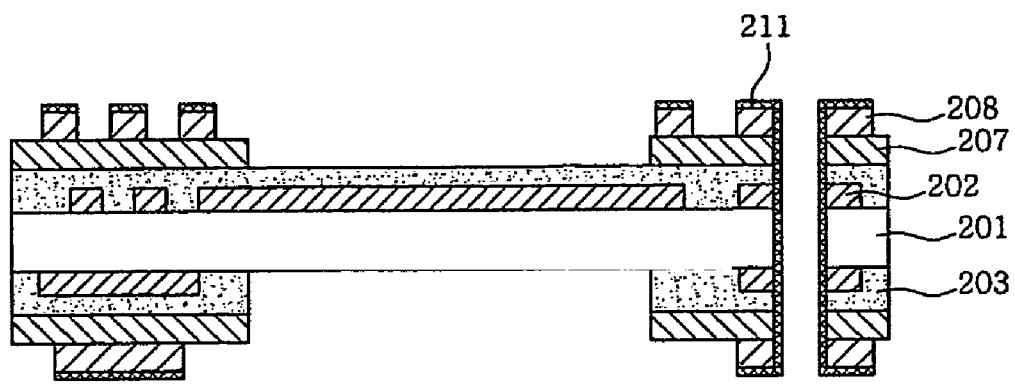

Subsequently, the adhesive tape 206 is removed. The adhesive tape 206 is separated from the adhesion surface of the substrate by ultraviolet rays or predetermined treatments as described above, and a description will be given of the removal of the adhesive tape, below. FIGS. 4a to 4c illustrate the removal of the adhesive tape 206.

In FIG. 4a, ultraviolet rays are uniformly radiated onto the flexible portion 205 of the substrate of FIG. 3e, to which the adhesive tape 206 is attached, or predetermined treatments are conducted to separate the adhesive tape 206 from the substrate.

If "Selfa" is used as the adhesive tape 206, nitrogen gas is generated at the adhesion surface of the adhesive tape 206, thus the adhesive tape 206 is separated from the substrate to form a cavity 206b between a separated adhesive tape part 206a and the substrate as shown in FIG. 4b.

In FIG. 4c, a release ink or a release film is removed. Since the adhesive tape 206 is already separated from the substrate, the removal of the adhesive tape is very easy. If Selfa, manufactured by Sekisui Chemical Co., Ltd. in Japan, is used as the adhesive tape 206, the adhesive tape is separated from the substrate due to nitrogen gas generated at the adhesion surface. Accordingly, the adhesive tape 206 is very easily removed without using additional force.

As described above, in a method of fabricating a rigid flexible PCB according to the present invention, a problem of a gap between layers, which is caused by a height difference between a rigid portion and a flexible portion, is avoided, thereby reliably exposing an etching resist, resulting in precise formation of a circuit pattern.

Furthermore, in the method of fabricating the rigid flexible PCB according to the present invention, problems of flow of an insulating base film onto the flexible portion, which are caused by the height difference between the rigid and flexible portions, are avoided in the course of fabricating the rigid flexible PCB, thereby realizing a minimum curvature radius of the flexible portion that is the same as a set design value.

Additionally, the present invention provides the method of fabricating the rigid flexible PCB, in which reliability and defective fractions of products are significantly improved.

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced other than as specifically described.

What is claimed is:

1. A method of fabricating a rigid flexible printed circuit board, comprising the steps of:
    forming first circuit patterns on both sides of a flexible base substrate;
    applying a coverlay on at least one of a portion of the first circuit patterns and the entire first circuit patterns;
    attaching self-detachable adhesive tapes to flexible portions of both sides of the flexible base substrate;

layering rigid insulating layers on rigid portions of both sides of the flexible base substrate;

forming via holes and second circuit patterns on the rigid portions of the flexible base substrate;

conducting a predetermined treatment process on the self-detachable adhesive tapes to separate the self-detachable adhesive tapes from the flexible base substrate; and removing the self-detachable adhesive tapes.

2. The method as set forth in claim 1, wherein the step of forming the first circuit patterns comprises the steps of:

layering copper foils on both sides of the flexible base substrate;

forming etching resist patterns on the copper foils; and etching the copper foils.

3. The method as set forth in claim 1, wherein the step of conducting the predetermined treatment process comprises the step of:

radiating ultraviolet rays onto the self-detachable adhesive tapes.

4. The method as set forth in claim 3, wherein the step of radiating the ultraviolet rays comprises the step of:

uniformly radiating the ultraviolet rays onto the self-detachable adhesive tapes to generate gas at surfaces of the self-detachable adhesive tapes.

5. The method as set forth in claim 1, wherein the step of forming the via holes and the second circuit patterns comprises the steps of:

layering copper foils on both sides of the flexible base substrate;

forming the via holes through predetermined portions of the flexible base substrate;

plating walls of the via holes; and forming the second circuit patterns on the rigid portions of the flexible base substrate.

6. The method as set forth in claim 5, wherein the step of forming the second circuit patterns comprises the steps of:

applying etching resists on both sides of the flexible base substrate;

patterning the etching resists; and etching the flexible base substrate to form the second circuit patterns.

\* \* \* \* \*